(12) United States Patent
Li et al.

(10) Patent No.: US 11,393,819 B2
(45) Date of Patent: Jul. 19, 2022

(54) SEMICONDUCTOR DEVICE IMPLEMENTED WITH BURIED RAILS

(71) Applicant: QUALCOMM Incorporated, San Diego, CA (US)

(72) Inventors: Xia Li, San Diego, CA (US); Bin Yang, San Diego, CA (US); Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/924,757

(22) Filed: Jul. 9, 2020

(65) Prior Publication Data
US 2022/0013522 A1    Jan. 13, 2022

(51) Int. Cl.
*H01L 27/092* (2006.01)
*H01L 23/528* (2006.01)
*H01L 21/8234* (2006.01)
*H01L 29/66* (2006.01)
*H01L 29/78* (2006.01)

(52) U.S. Cl.
CPC .. *H01L 27/0924* (2013.01); *H01L 21/823431* (2013.01); *H01L 23/5286* (2013.01); *H01L 29/6681* (2013.01); *H01L 2029/7858* (2013.01)

(58) Field of Classification Search
CPC ......... H01L 27/0924; H01L 21/823431; H01L 23/5286; H01L 29/6681
See application file for complete search history.

(56) References Cited

U.S. PATENT DOCUMENTS

| | | | |
|---|---|---|---|
| 10,720,391 B1* | 7/2020 | Paul | H01L 29/0673 |
| 2017/0338327 A1* | 11/2017 | Liu | H01L 29/66795 |
| 2018/0374791 A1* | 12/2018 | Smith | H01L 21/743 |
| 2019/0172828 A1* | 6/2019 | Smith | H01L 27/124 |
| 2020/0027777 A1* | 1/2020 | Sung | H01L 21/3065 |
| 2020/0135634 A1* | 4/2020 | Chiang | H01L 21/76897 |

* cited by examiner

*Primary Examiner* — Christine A Enad
(74) *Attorney, Agent, or Firm* — Patterson+ Sheridan, L.L.P.

(57) ABSTRACT

Certain aspects of the present disclosure generally relate to a semiconductor device with buried rails (e.g., buried power and ground rails). One example semiconductor device generally includes a substrate; a first rail, wherein a portion of the first rail is disposed in the substrate, the portion of the first rail having a first width greater than a second width of another portion of the first rail; a second rail, wherein a portion of the second rail is disposed in the substrate, the portion of the second rail having a third width greater than a fourth width of another portion of the second rail; and one or more transistors disposed above the substrate and between the first rail and the second rail.

18 Claims, 17 Drawing Sheets

SEMICONDUCTOR DEVICE IMPLEMENTED WITH BURIED RAILS

BACKGROUND

Field of the Disclosure

Certain aspects of the present disclosure generally relate to electronic components and, more particularly, to a semiconductor device.

Description of Related Art

A continued emphasis in semiconductor technology is to create improved performance semiconductor devices at competitive costs. This emphasis over the years has resulted in miniaturization of semiconductor devices, made possible by continued advances in semiconductor processes and materials in combination with new and sophisticated device designs. Large numbers of transistors are employed in integrated circuits (ICs) in many electronic devices. For example, components such as central processing units (CPUs), graphics processing units (GPUs), and memory systems each employ a large quantity of transistors for logic circuits and memory devices.

Complementary metal-oxide-semiconductor (CMOS) transistors implement complementary and symmetrical pairs of p-type and n-type metal-oxide-semiconductor field-effect transistors (MOSFETs) for logic functions. CMOS technology has seen applications in ICs, microprocessors, microcontrollers, memory chips, and other digital logic circuits. An advantage of CMOS is that both low-to-high and high-to-low output transitions are fast since the p-type metal-oxide-semiconductor (PMOS) pull-up transistors have low resistance when switched on, unlike the load resistors in n-type metal-oxide-semiconductor (NMOS) logic. In addition, the output signal swings the full voltage between the low and high power rails. This strong, more nearly symmetric response also makes CMOS more resistant to noise.

Gate-all-around (GAA) field-effect transistors (FETs) have enabled a reduction of transistor node sizes to 10 nm, and in some cases down to 3 nm. In certain cases, GAA FETs have nanowires, which form channels, embedded in gate material disposed between source and drain regions. GAA FETs may be designed to have a lower threshold voltage than similar fin FET (FinFET) devices, because GAA FETs have better short channel control.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include increased volume of buried first and second rails, decreased resistance within the buried first and second rails, and decreased cost of production.

Certain aspects of the present disclosure provide a semiconductor device. The semiconductor device generally includes a substrate; a first rail, wherein a portion of the first rail is disposed in the substrate, the portion of the first rail having a first width greater than a second width of another portion of the first rail; a second rail, wherein a portion of the second rail is disposed in the substrate, the portion of the second rail having a third width greater than a fourth width of another portion of the second rail; and one or more transistors disposed above the substrate and between the first rail and the second rail.

Other aspects of the present disclosure provide a method for fabricating a semiconductor device. The method generally includes forming one or more transistors above a substrate; forming a first rail, wherein a portion of the first rail is formed in the substrate, the portion of the first rail having a first width greater than a second width of another portion of the first rail; forming a second rail, wherein a portion of the second rail is formed in the substrate, the portion of the second rail having a third width greater than a fourth width of another portion of the second rail, wherein the one or more transistors are between the first rail and the second rail.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to a semiconductor device implemented using one or more slabs of buried metal for power and/or ground rails. In some implementations, complementary metal-oxide-semiconductor (CMOS) transistors may be implemented with a buried power rail using a backside process; however, such a fabrication process may incur a high cost. Certain aspects of the present disclosure relate to techniques for fabrication of a semiconductor device including CMOS transistors with improved performance and reduced size as compared to conventional implementations. In certain aspects, a buried rail may be implemented using a dummy fin, as described in more detail herein. The buried rail may serve to increase performance and reduce size and volume for low power technologies, as compared to conventional implementations. In some implementations, rails may be implemented with a rectangular shape, and with relatively high resistance. In certain aspects of the present disclosure, the buried power rail may be implemented with an oval shape having a larger width than a width of an upper region of the buried power rail, resulting in a decrease of the resistance of the buried rail due to an increased cross-sectional area without sacrificing volume. In certain aspects, the semiconductor device described herein may be incorporated in high performance central processing unit (CPU), graphics processing unit (GPU), neural processing unit (NPU), memory, or 5$^{th}$ generation (5G) millimeter wave (mmW) high performance radio frequency (RF) and analog devices. In another certain aspects, the semiconductor device described herein may be incorporated to shrink a standard cell library height to enable continuation of technology scaling.

Figure 1A:
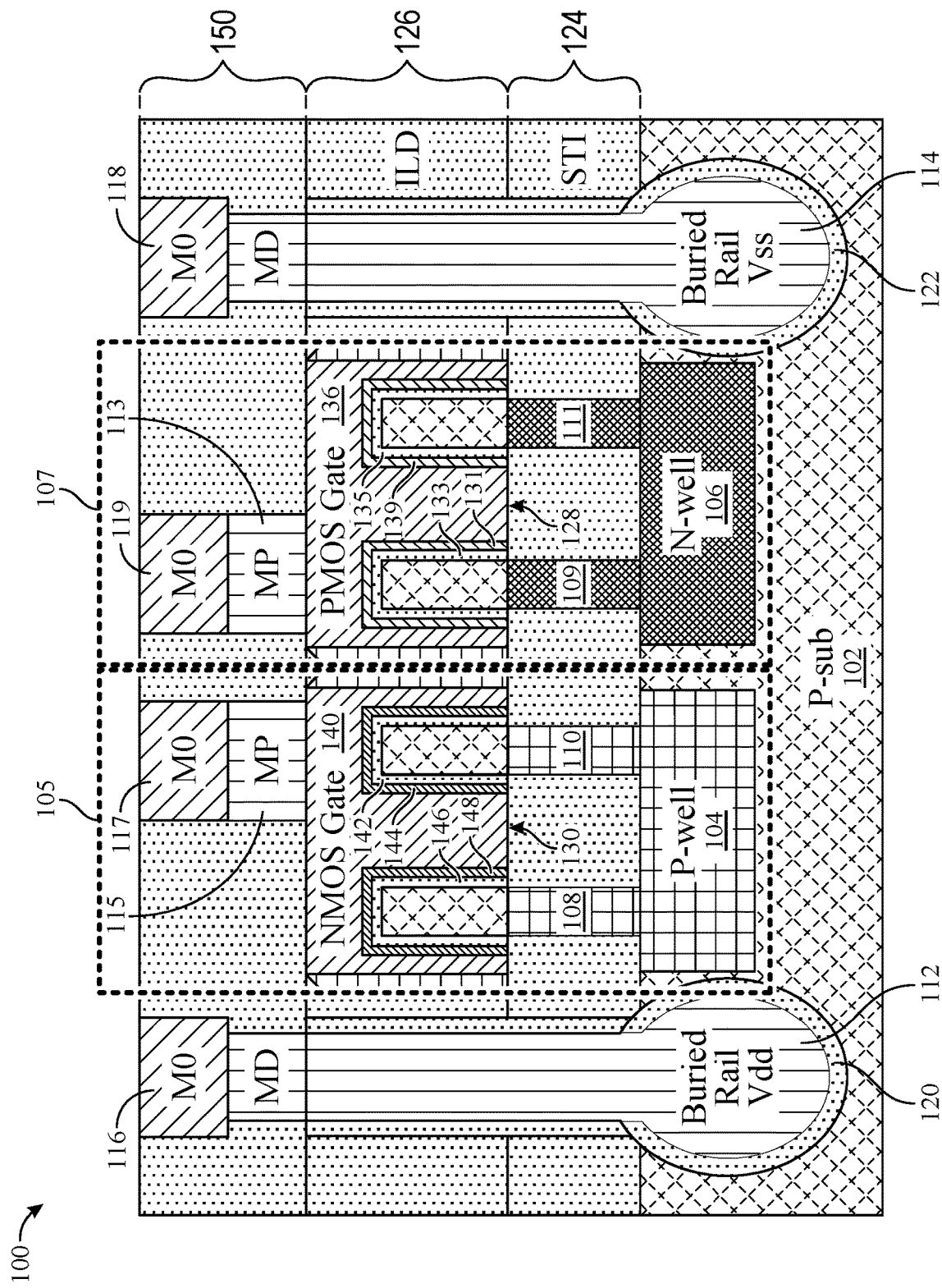
FIGS. 1A-1C illustrate cross-sections of example semiconductor devices, in accordance with certain aspects of the present disclosure.

FIG. 1A illustrates a semiconductor device 100 implementing fin field-effect transistors (FinFETs), in accordance with certain aspects of the present disclosure. FIG. 1A is a cross-section through line Y-Y' in FIG. 2A.

The semiconductor device 100 may be a CMOS transistor having an n-type metal-oxide-semiconductor (NMOS) transistor 105 and a p-type metal-oxide-semiconductor (PMOS) transistor 107. The NMOS transistor 105 and the PMOS transistor 107 may be implemented on a substrate 102, as illustrated. The substrate 102 may be p-type doped. The NMOS transistor 105 may include a p-type well 104, and the PMOS transistor 107 may include an n-type well 106. The wells 104, 106 may be disposed adjacent to the substrate 102, as illustrated.

The NMOS transistor 105 may include fins 108, 110 formed above well 104, as shown. The PMOS transistor 107 may include fins 109, 111 formed above well 106. Furthermore, the semiconductor device 100 may include rails 112, 114 (e.g., a power rail and ground rail). Rails 112, 114 may be buried, in part, in the substrate 102, as illustrated. The bottom portion of the rails 112, 114 may be oval-shaped or circular in cross-section, as described herein. Each of rails 112, 114 may have a contact shaft extending from the bottom of the rail to a respective one of contacts 116 and 118 (also referred to herein as "contact regions").

In certain aspects, oxide layers 120, 122 (e.g., dielectric layers or regions) may be formed around respective rails 112, 114. The oxide layers 120, 122 may electrically isolate the buried rails 112, 114 from the substrate 102. The oxide layers may be formed using atomic layer deposition (ALD), chemical vapor deposition (CVD), or physical vapor deposition (PVD) process or silicon oxidation re-growth process, for example.

In certain aspects, the semiconductor device 100 may further include an oxide layer 124 disposed above the substrate 102. The oxide layer 124 may be a shallow trench isolation (STI) layer. Portions of the rails 112, 114 and the fins 108, 110, 109, and 111 may be adjacent to the oxide layer 124, as illustrated.

Semiconductor device 100 may further include an oxide layer 126, which may be above oxide layer 124. The oxide layer 126 may be an inter-layer dielectric (ILD) layer. Disposed adjacent to the oxide layer 126 may be a gate structure 128 and a gate structure 130. Furthermore, a portion of rails 112, 114 may be disposed adjacent to the oxide layer 126.

The PMOS transistor 107 may include the gate structure 128 having a gate region 136 adjacent to the top portions of fins 109, 111. Disposed between the gate region 136 and the top portion of fin 109 may be a high-κ metal gate layer 131 and an oxide layer 133, where κ represents permittivity. Moreover, disposed between the gate region 136 and the top portion of fin 111 may be a high-κ metal gate layer 135 and an oxide layer 139.

The NMOS transistor 105 may include the gate structure 130 having a gate region 140 adjacent to the top portions of the fins 108, 110. Disposed between the gate region 140 and the top portion of fin 108 may be a high-κ metal gate layer 148 and an oxide layer 146. Moreover, disposed between the gate region 140 and the top portion of fin 110 may be a high-κ metal gate layer 144 and an oxide layer 142.

An oxide layer 150 may be disposed above the oxide layer 126. Contacts 116, 117, 118, 119 may be disposed adjacent to the oxide layer 150. Conductive regions 115, 113 may be disposed above, respectively, gate structures 130 and 128 and may electrically couple respective gate structures 130, 128 to contacts 117 and 119.

Figure 1B:
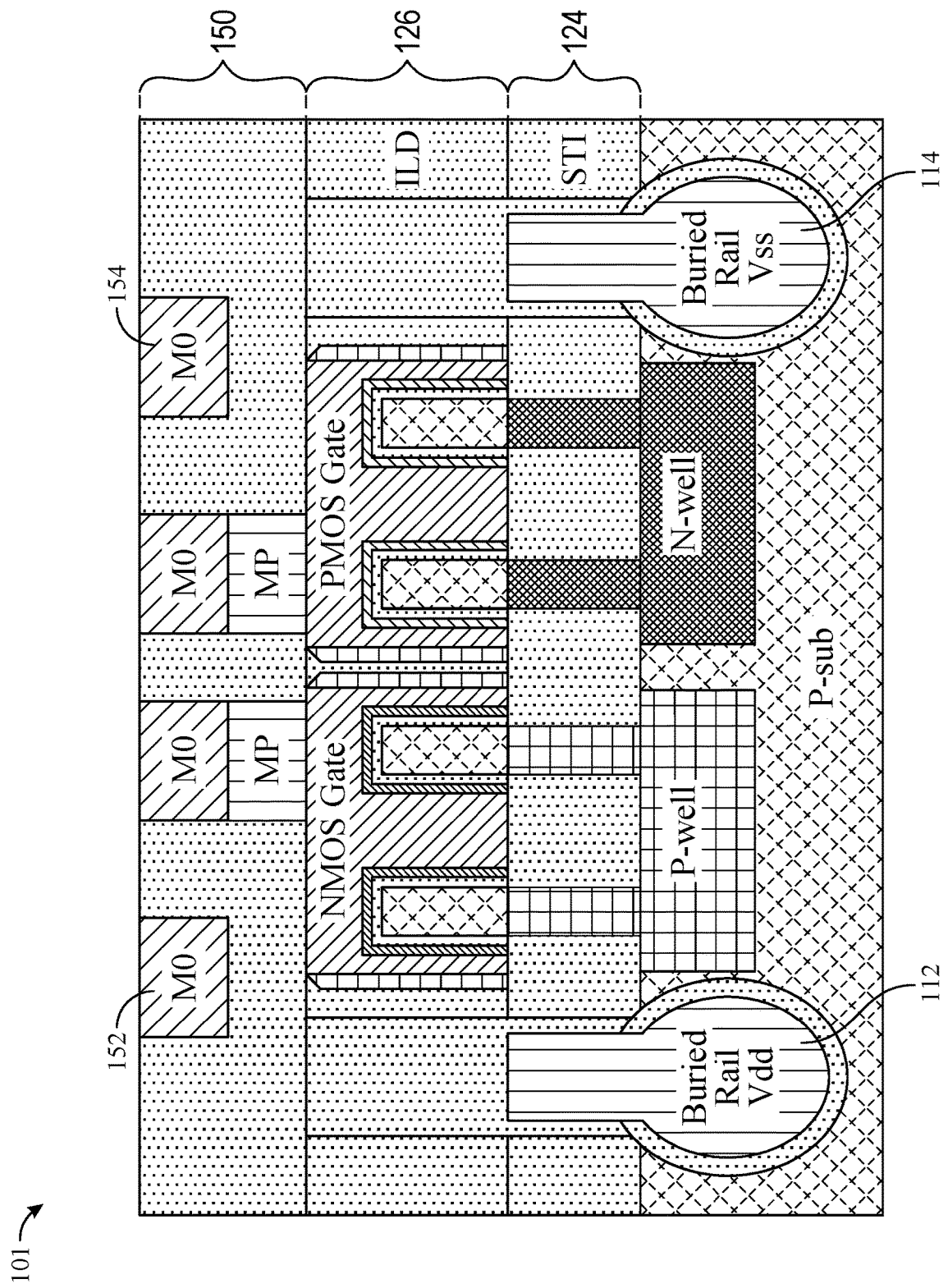

FIG. 1B illustrates a semiconductor device 101 having recessed buried rails, in accordance with certain aspects of the present disclosure. For example, the rails 112, 114 may be recessed during fabrication such that portions of the oxide layers 126, 150 are above rails 112, 114. As illustrated, the semiconductor device 101 may also include routing regions 152, 154.

Figure 1C:
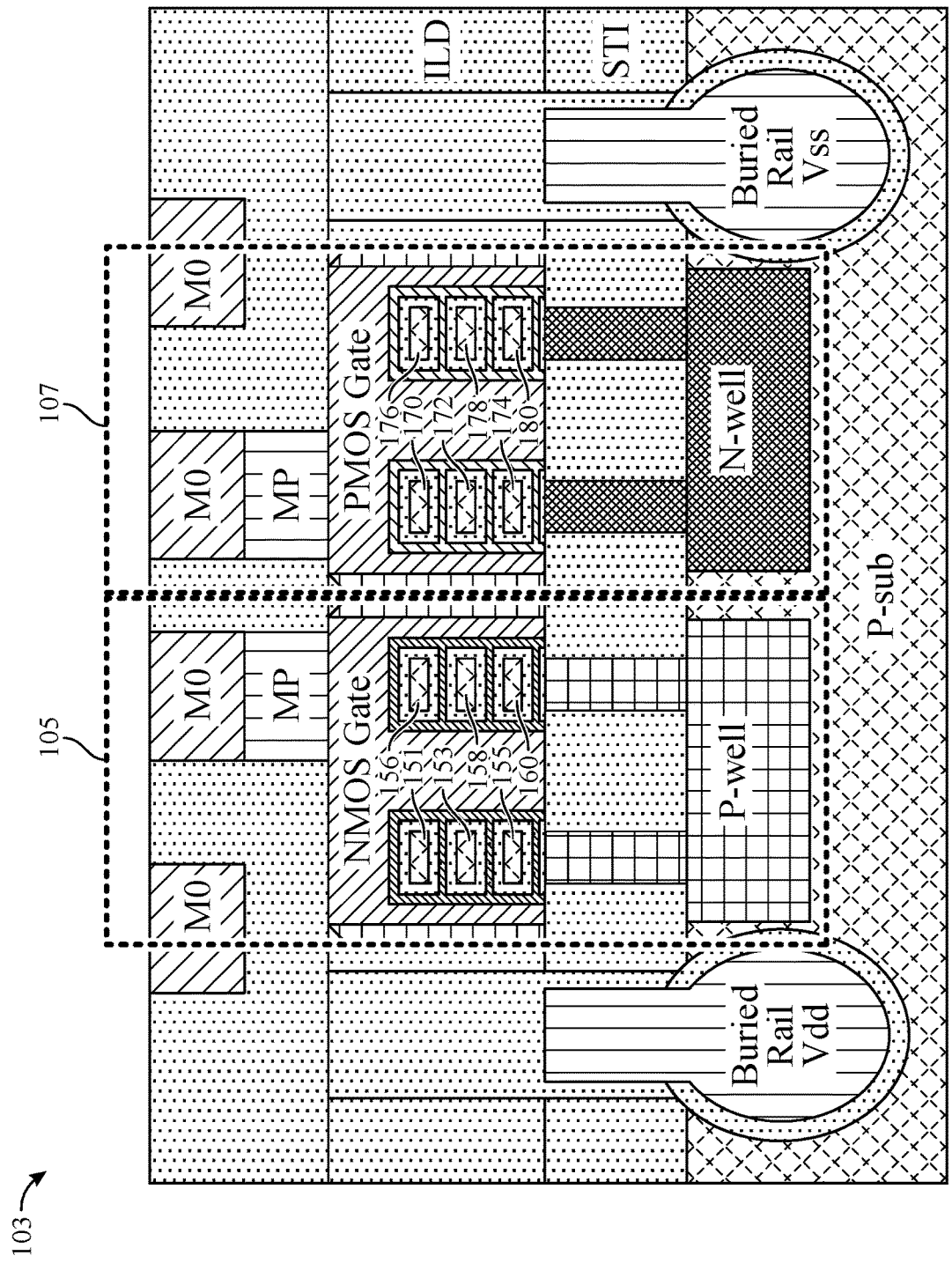

FIG. 1C illustrates a semiconductor device 103 implemented with gate-all-around (GAA) field-effect transistors (FETs), in accordance with certain aspects of the present disclosure. For example, channels of NMOS transistor 105 may be implemented with nanoslabs 151, 153, 155, 156, 158, 160. Moreover, channels of the PMOS transistors 107 may be implemented with nanoslabs 170, 172, 174, 176, 178, 180, as illustrated.

Figure 2A:
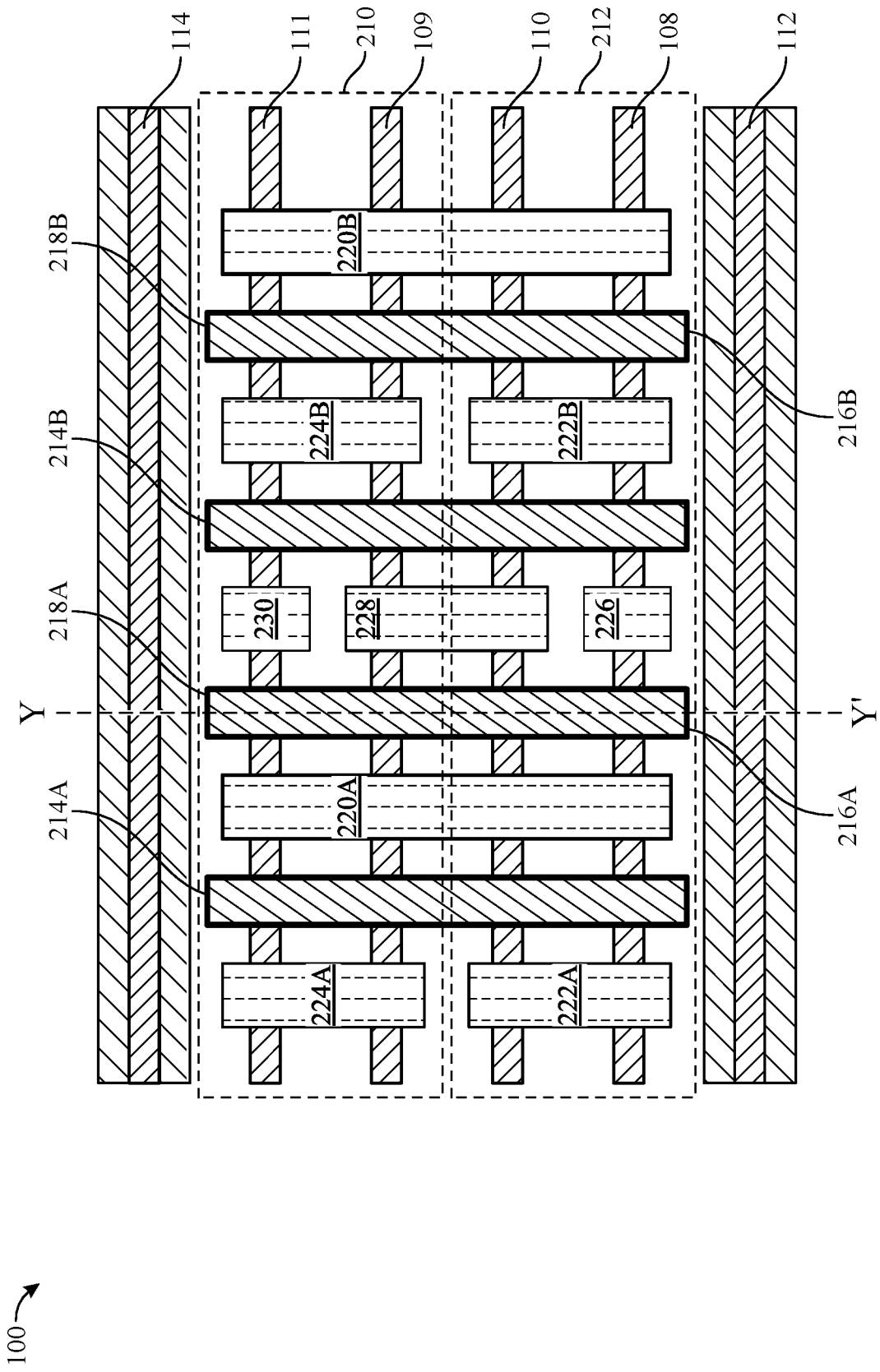
FIGS. 2A-2B illustrate overhead views of example semiconductor devices, in accordance with certain aspects of the present disclosure.

FIG. 2A illustrates an overhead view of the example semiconductor device 100, in accordance with certain aspects of the present disclosure. The semiconductor device 100 has groups of NMOS and PMOS transistors, each group implemented with dual fins. As illustrated, the semiconductor device 100 includes a rail 112 and a rail 114. The semiconductor device 100 may also include PMOS transistors 210 (e.g., including PMOS transistor 107 of FIG. 1A) and NMOS transistors 212 (e.g., including the NMOS transistor 105 of FIG. 1A).

The semiconductor device 100 includes gate regions 214A, 214B (collectively referred to as "gate regions 214"), each forming a gate for one of the PMOS transistors 210 and one of the NMOS transistors 212. The semiconductor device 100 may also include gate regions 216A, 216B, each for one of the NMOS transistors 212, and gate regions 218A, 218B, each for one of the PMOS transistors 210. The gate region 218A may correspond to the gate region 136, and the gate region 218B may correspond to the gate region 140. Each of the PMOS transistors 210 and the NMOS transistors 212 may include source or drain (S/D) contacts 220A, 220B, each serving as a source or drain contact for one of the PMOS transistors 210 and one of the NMOS transistors 212.

Moreover, the semiconductor device 100 may include S/D contact 222A, 222B, each implemented for one of the NMOS transistors 212, as well as S/D contact 224A, 224B, each implemented for one of the PMOS transistors 210. Furthermore, the semiconductor device 100 may include an S/D contact 226 above fin 108, an S/D contact 228 above fins 110, 109, and an S/D contact 230 above fin 111. The S/D contact 228 may serve as the S/D contact for one of the PMOS transistors 210 and one of the NMOS transistors 212.

Figure 2B:
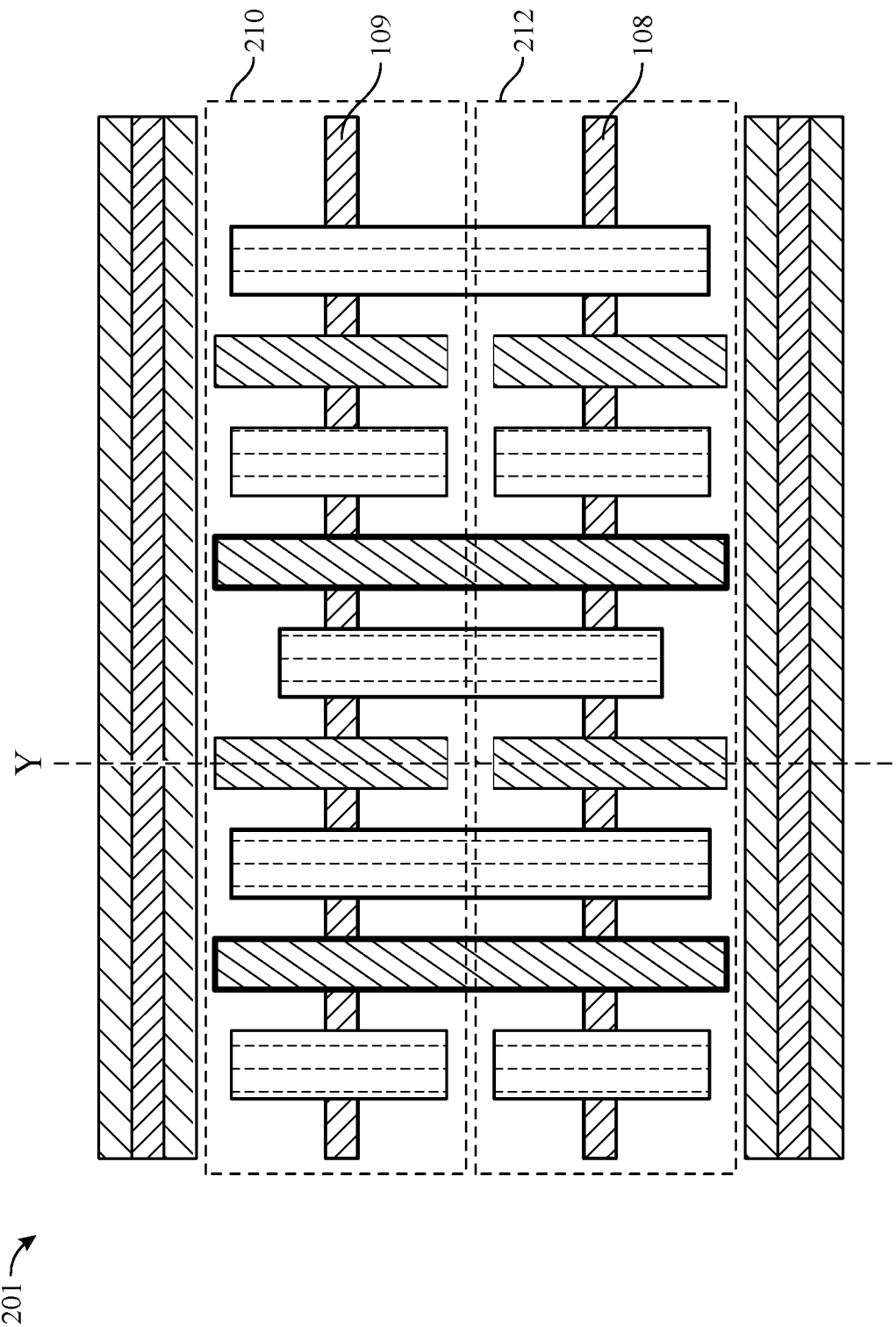

FIG. 2B illustrates a semiconductor device 201 having groups of NMOS and PMOS transistors, each group implemented with a single fin, in accordance with certain aspects of the present disclosure. For example, the PMOS transistors 210 may be implemented using fin 109, and the NMOS transistors 212 may be implemented using fin 108.

Figure 3A:
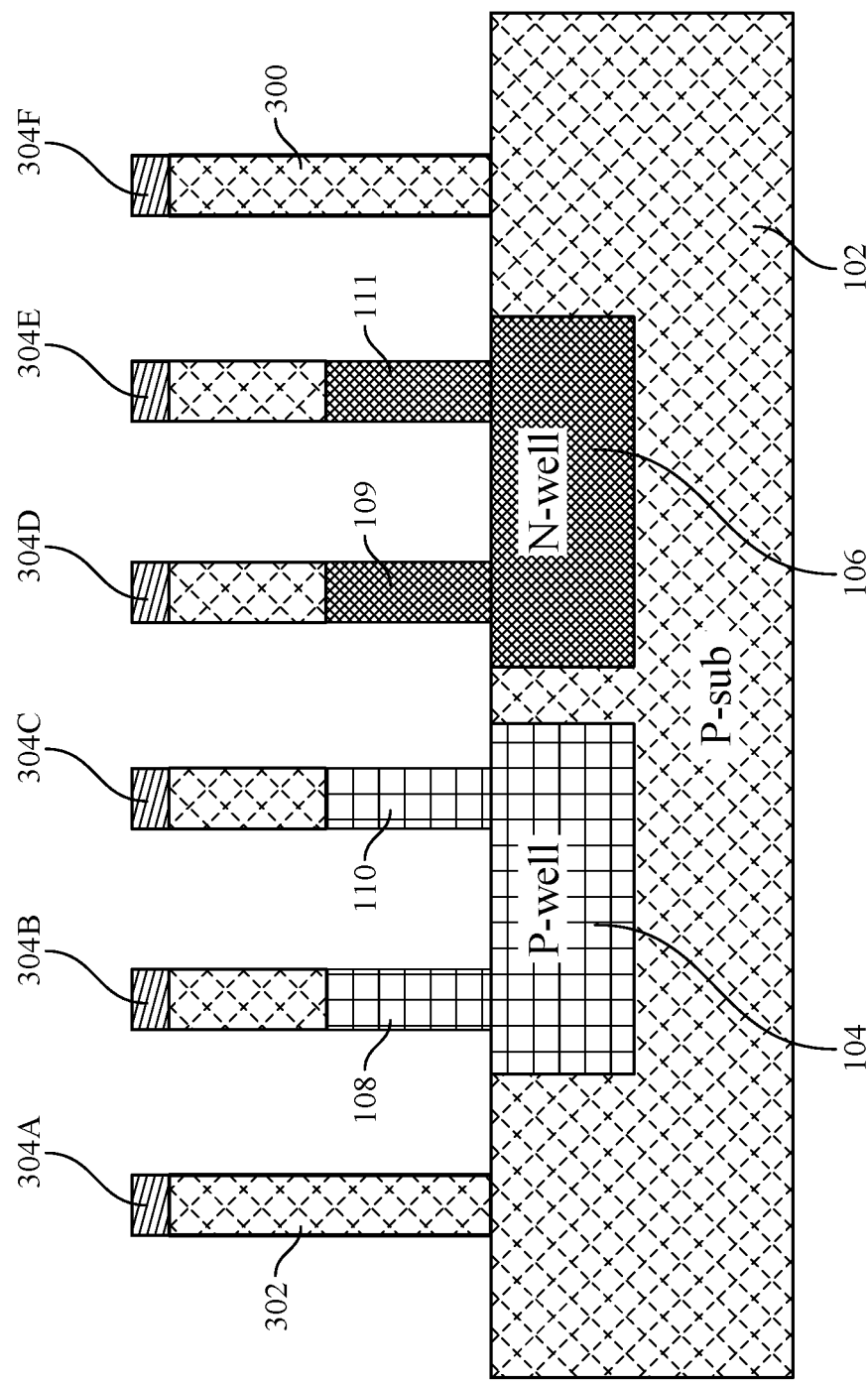
FIGS. 3A-3H and 4A-4C illustrate example operations for fabricating a semiconductor device, in accordance with certain aspects of the present disclosure.

FIGS. 3A-3H illustrate example operations for fabrication of the semiconductor device 100, in accordance with certain aspects of the present disclosure. As shown in FIG. 3A, wells 104, 106 may be formed in a substrate 102. Fins 108, 110 may be formed above well 104, and fins 109 and 111 may be formed above well 106. Additionally, dummy fins 300 and 302 may be formed above the substrate 102. Hard masks 304A, 304B, 304C, 304D, 304E, 304F may be formed above fins 302, 108, 110, 109, 111, 300, respectively, as illustrated.

Figure 3B:
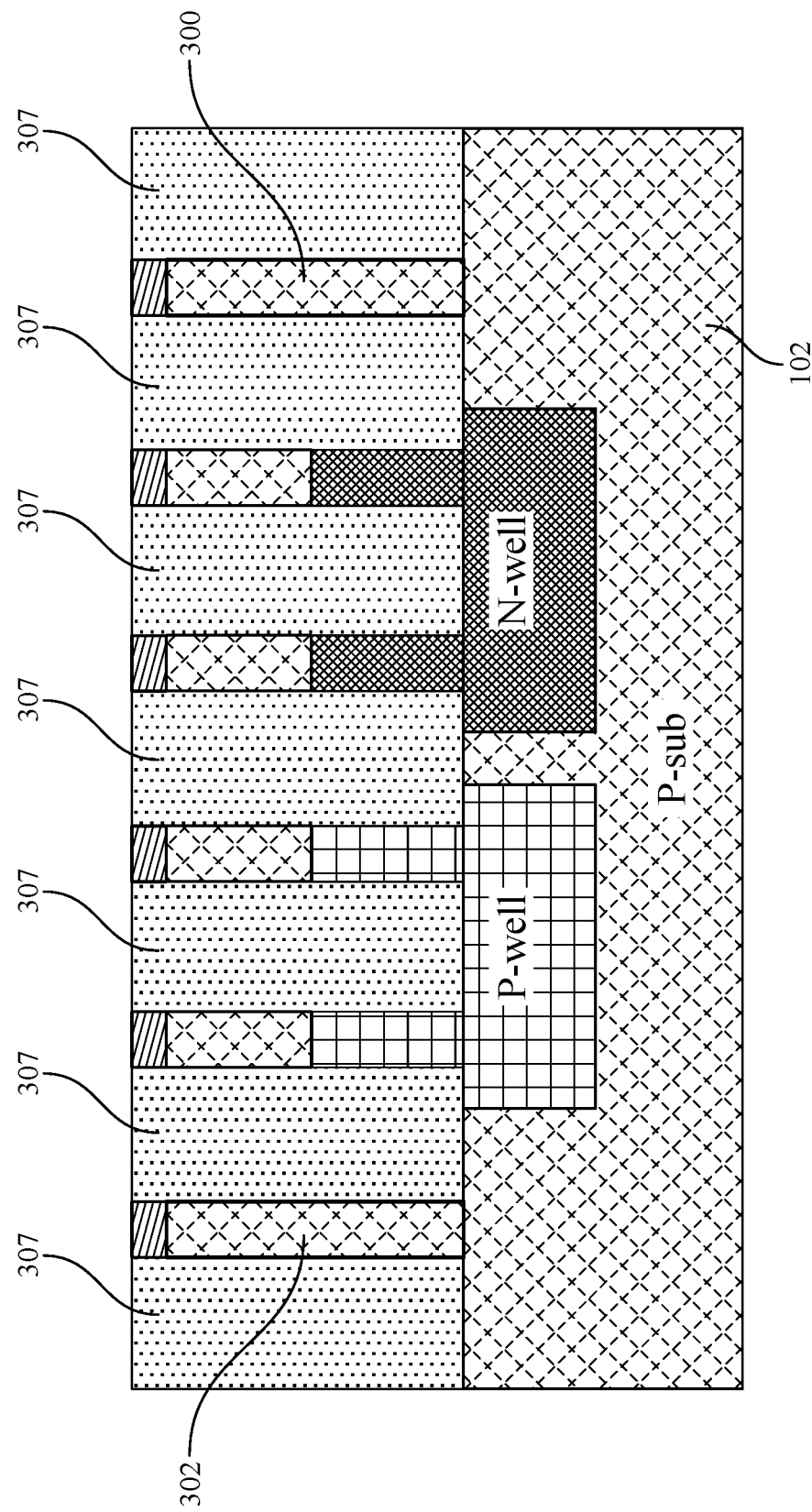
Figure 3C:
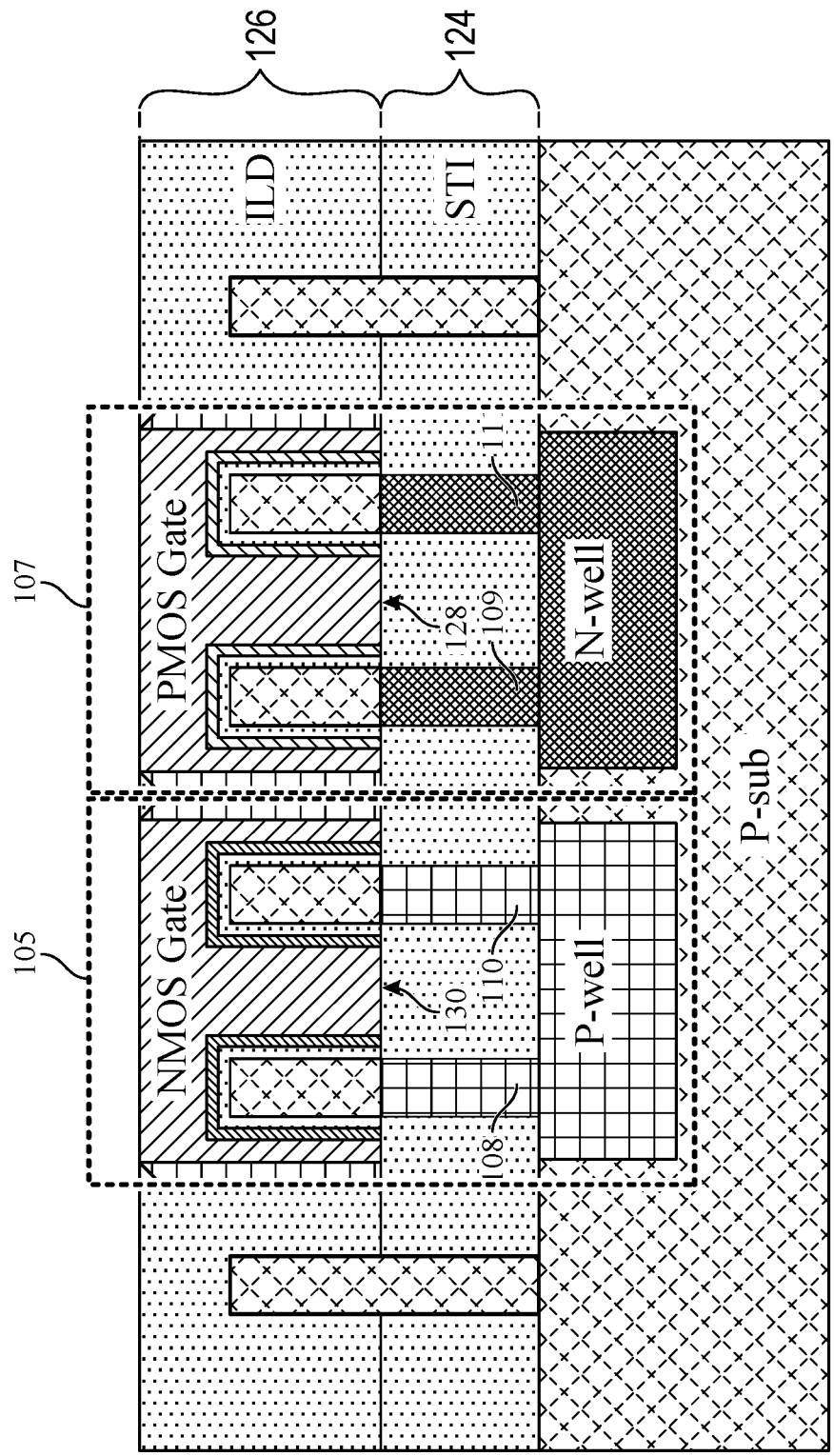

As illustrated in FIG. 3B, an oxide 307 may be deposited above the substrate 102. The oxide 307 may electrically isolate each of the fins from one another. After deposition, the oxide 307 may undergo chemical mechanical planarization (CMP). As illustrated in FIG. 3C, gate structures 128 and 130 may be formed adjacent to top portions of fins 108, 110, 109, 111.

Figure 3D:
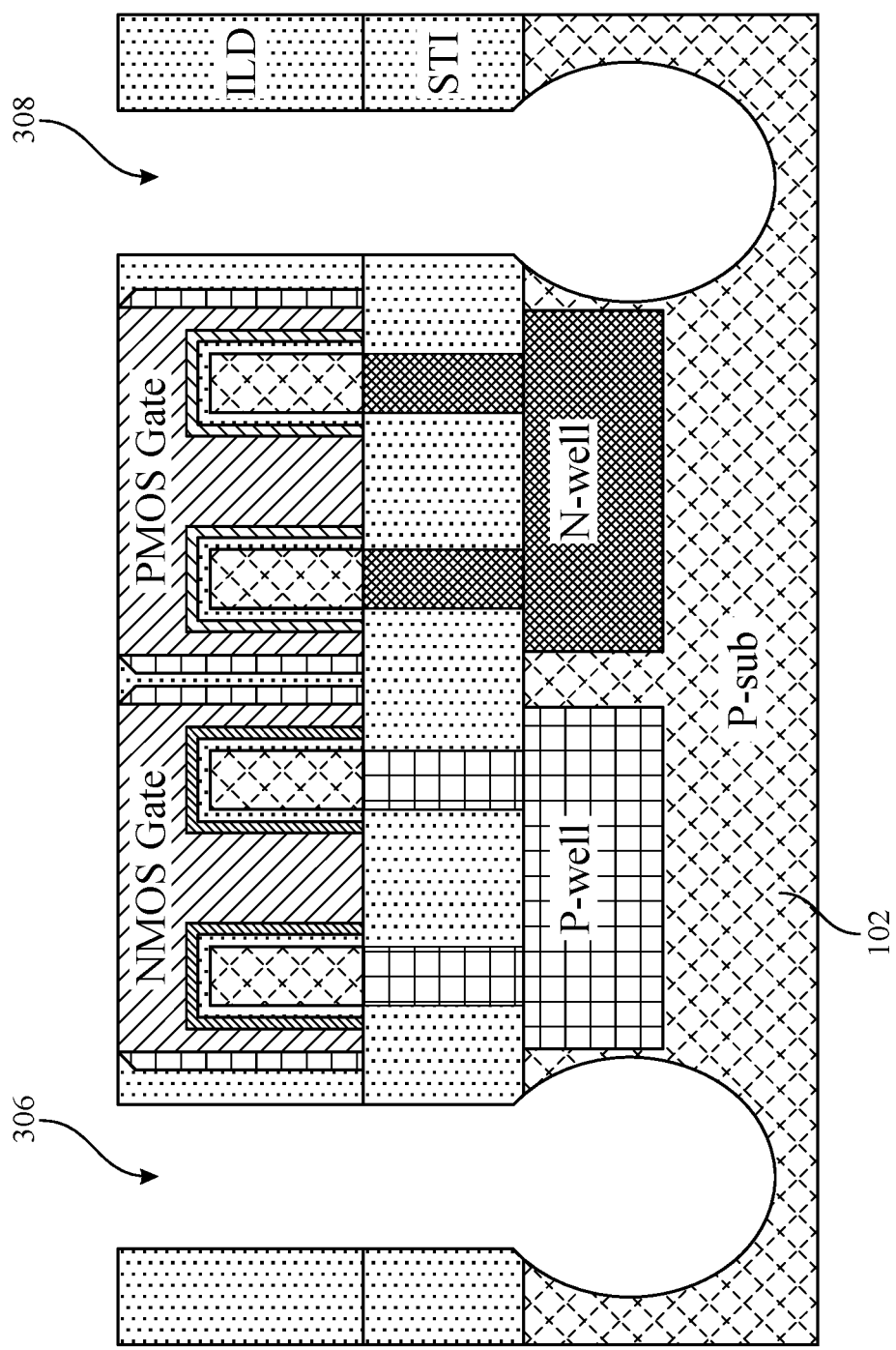

As illustrated in FIG. 3D, dummy fins 300, 302 may be etched to form holes 308 and 306, respectively. The formation of the dummy fins 300, 302 facilitates alignment for the etching and formation of holes 308, 306, respectively. As illustrated, a bottom portion of holes 306, 308 may be formed with an oval shape or circular shape in cross-section using isotropic silicon etching. The bottom portions of holes 306 and 308 may be disposed in the substrate 102, as illustrated.

Figure 3E:
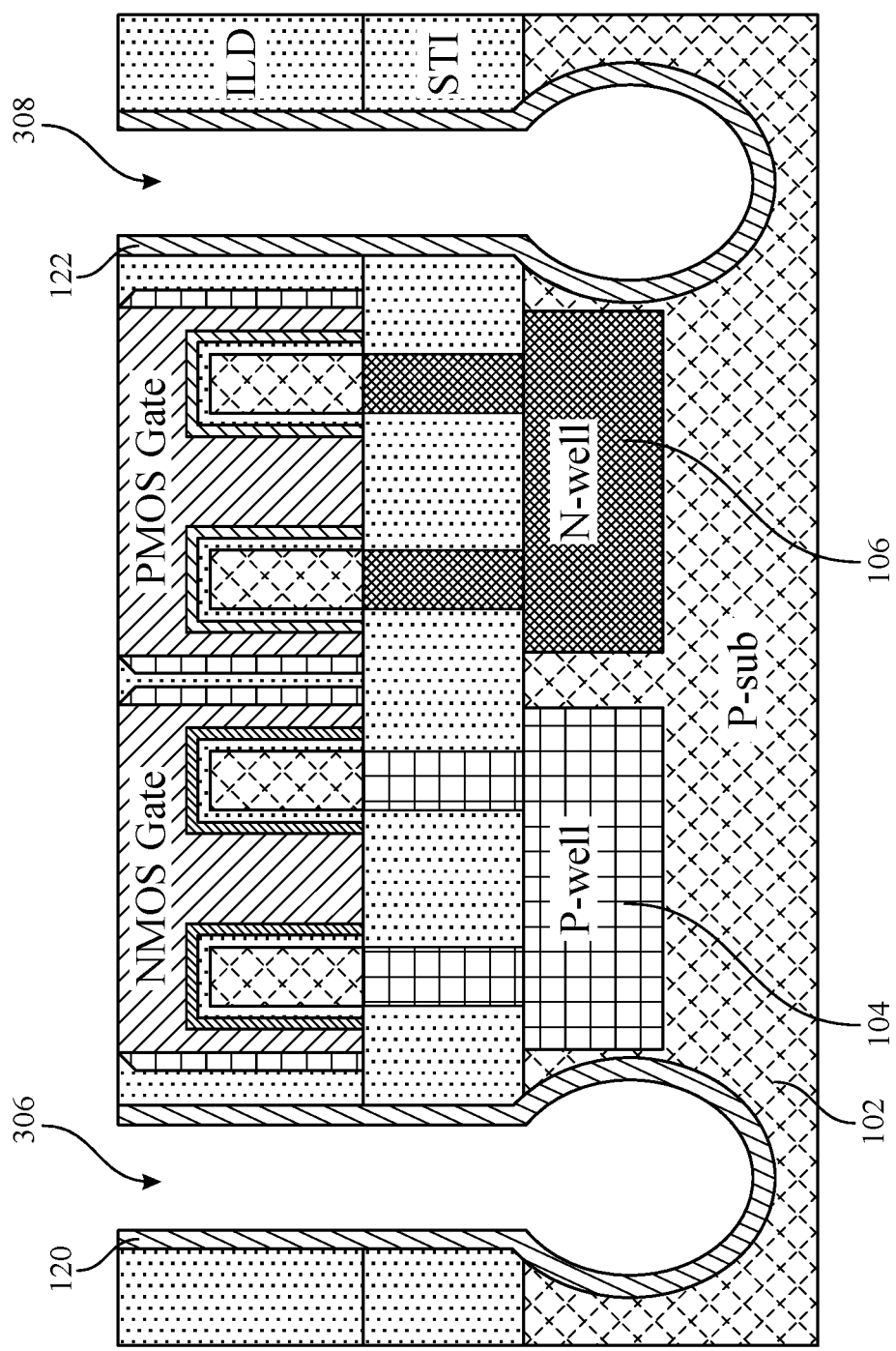
Figure 3F:
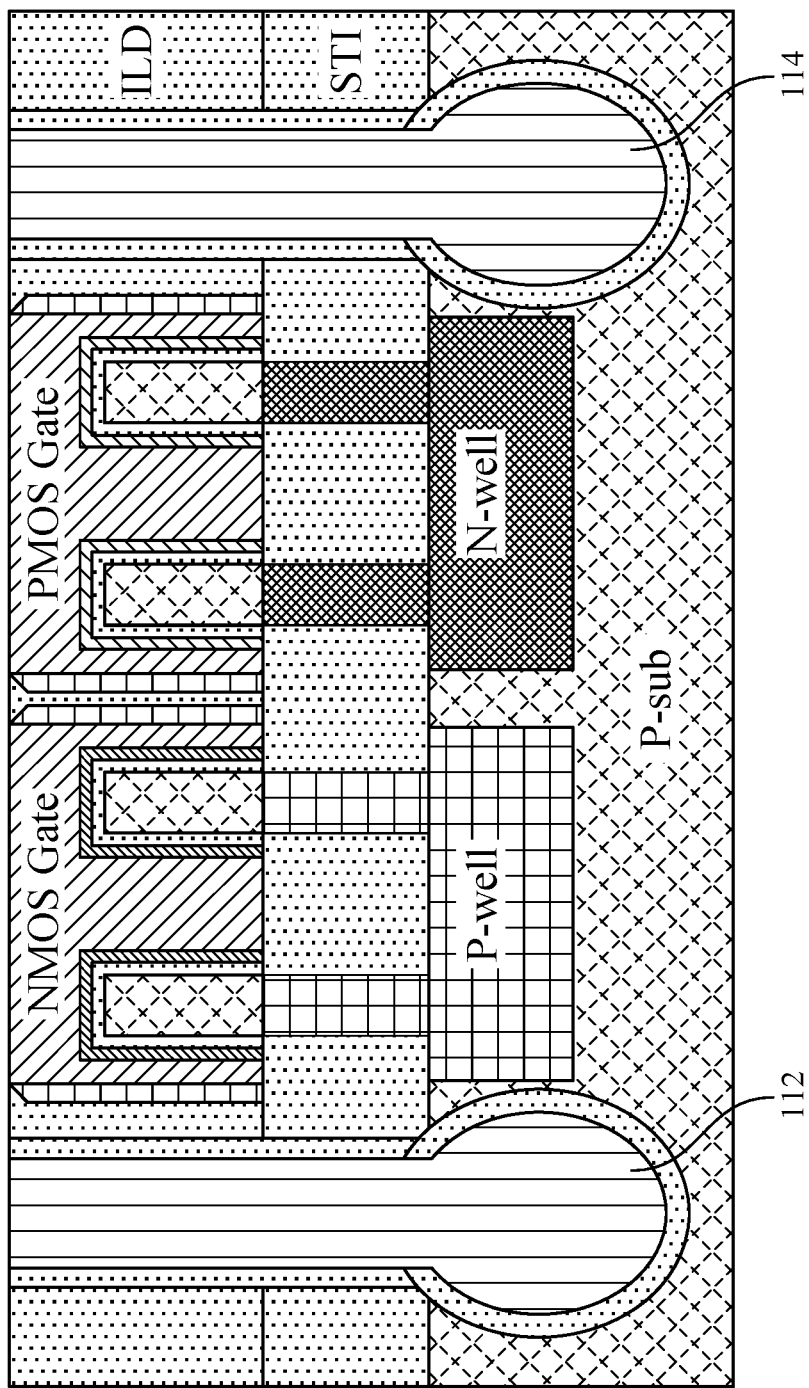

As shown in FIG. 3E, oxide layers 120, 122 may be deposited on the inner surfaces of the workpiece surrounding the holes 306 and 308, respectively, using atomic layer deposition (ALD), for example. The oxide layers 120, 122 may aid in electrically isolating rails to be formed in holes 306 and 308 from the wells 104, 106, as well as the substrate 102. As illustrated in FIG. 3F, metal or metal alloy may be deposited in holes 306 and 308 to form rails 112, 114. The upper surfaces of the rails 112, 114 may then undergo CMP.

Figure 3G:
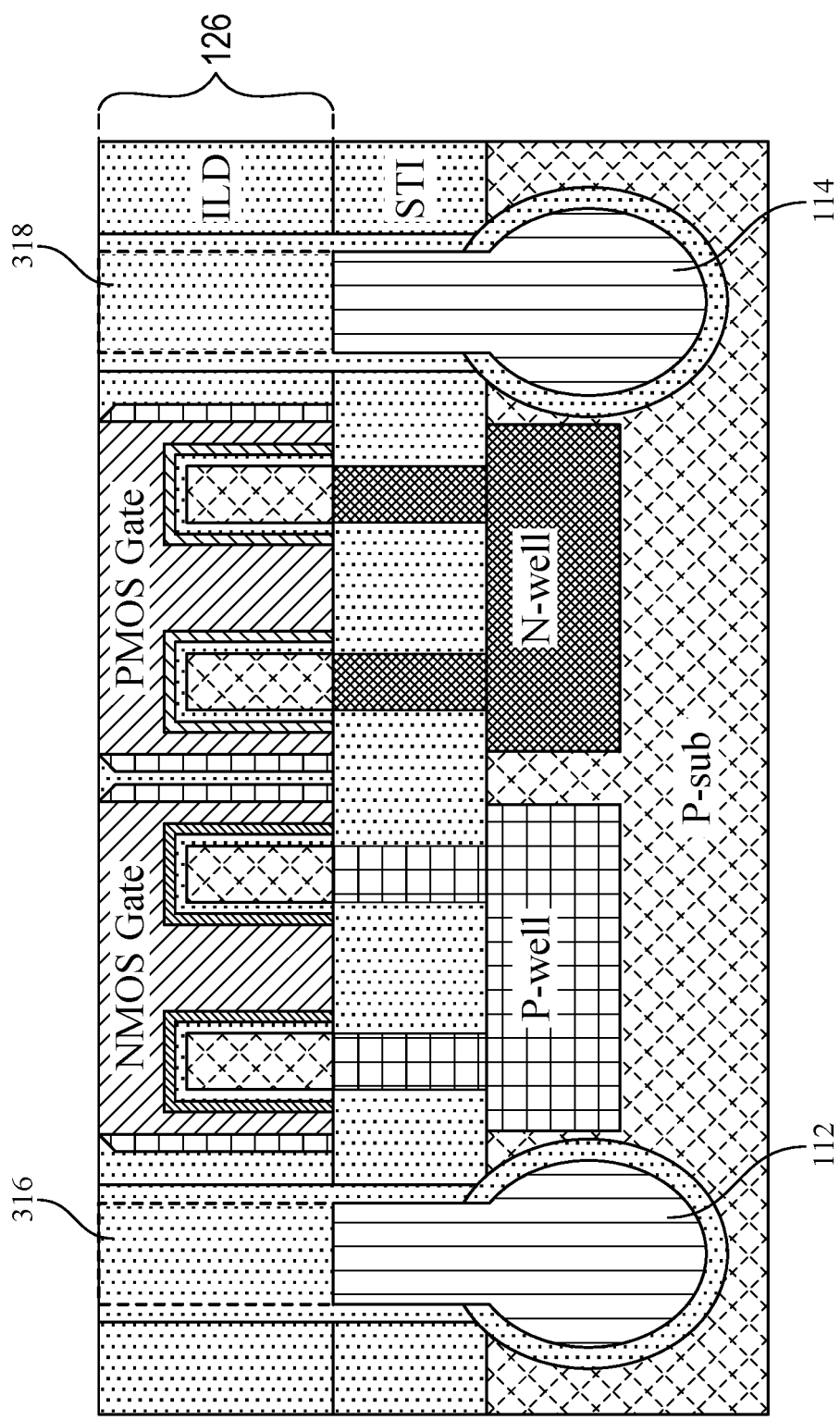
Figure 3H:
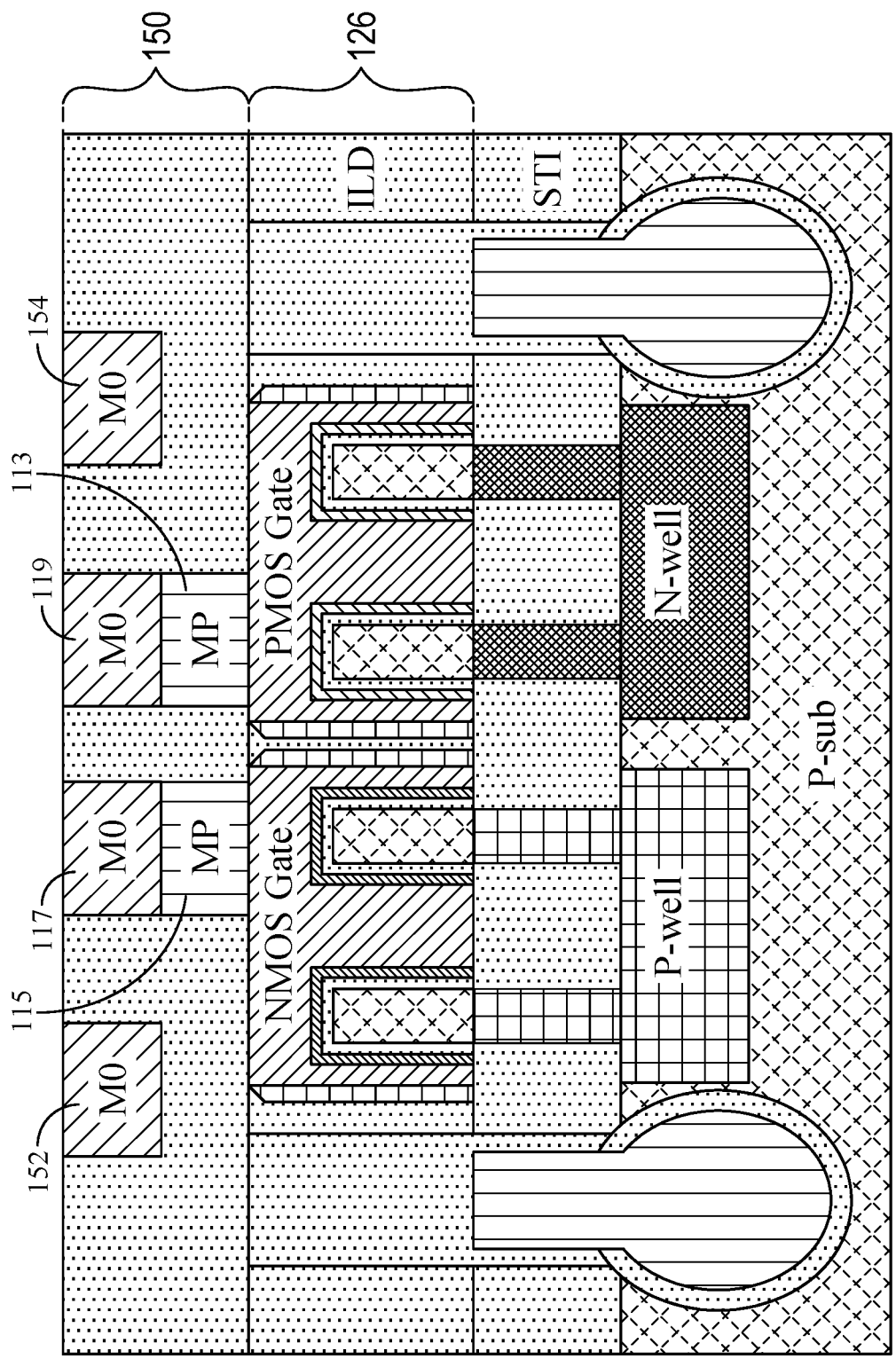

In certain aspects, as illustrated in FIG. 3G, the rails 112, 114 may be recessed using an etching process, followed by deposition of oxide 316, 318 above respective rails 112, 114 and CMP of the oxide layer 126. As illustrated in FIG. 3H, an oxide layer 150 may be disposed above the oxide layer 126, followed by formation of conductive regions 113, 115, contacts 117, 119, and routing regions 152, 154 in the oxide layer 150.

Figure 4A:
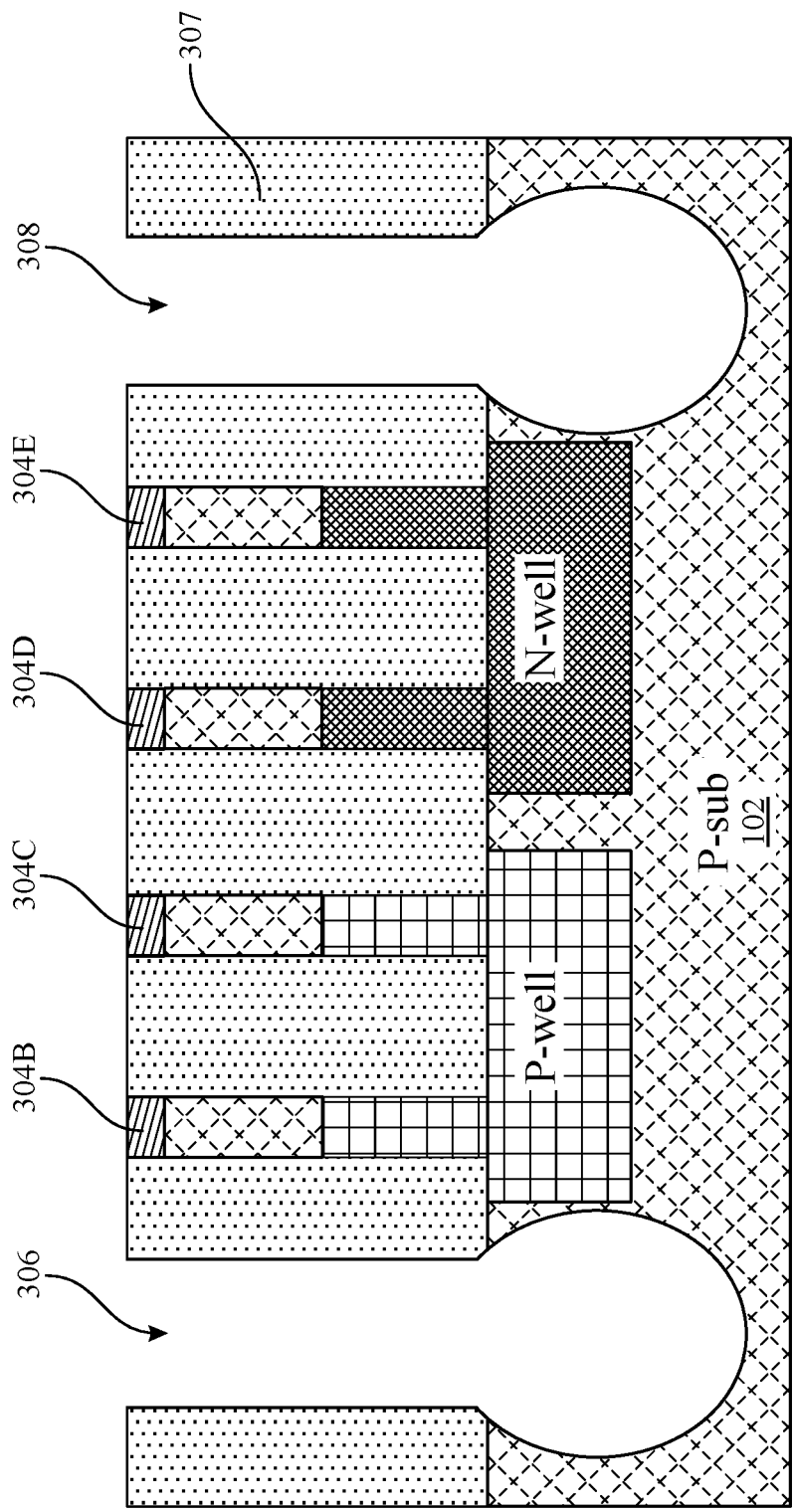
Figure 4B:
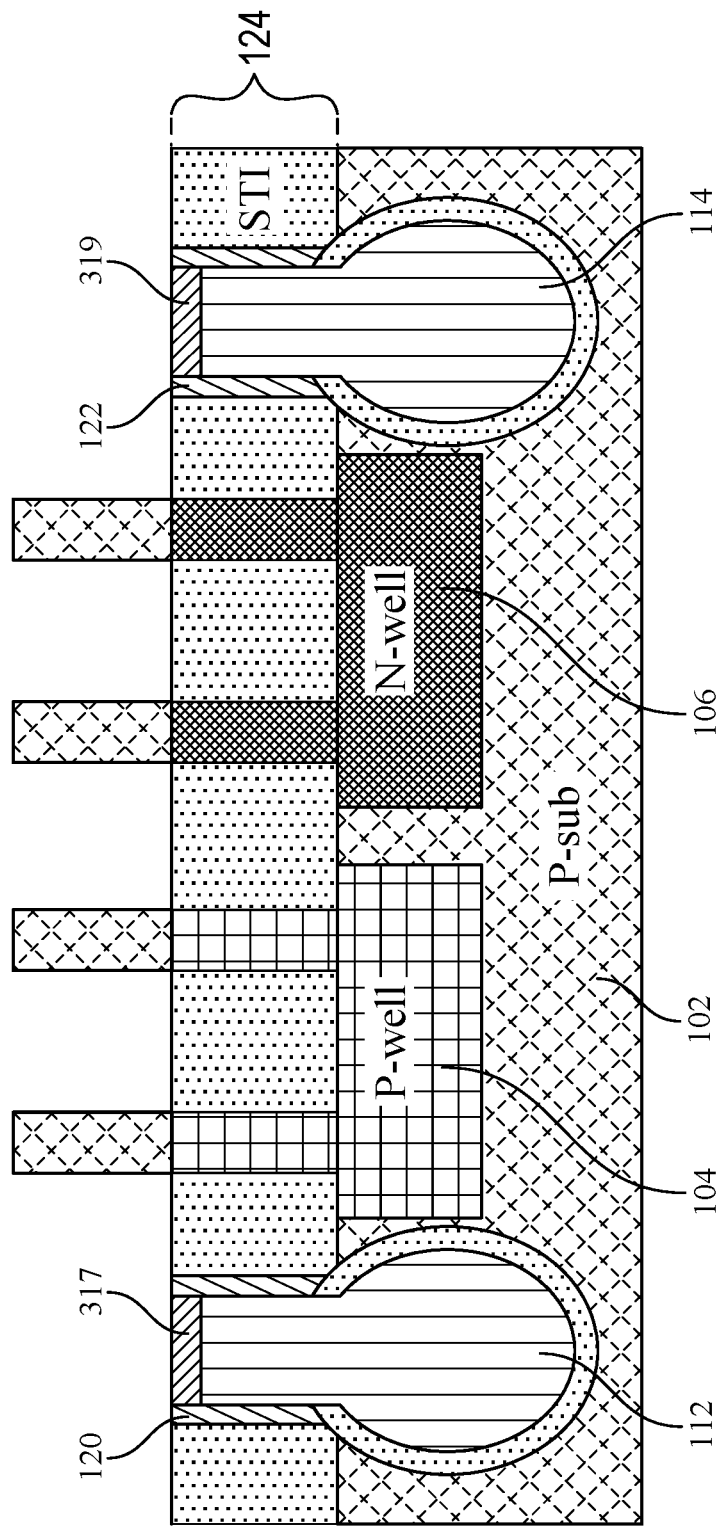
Figure 4C:
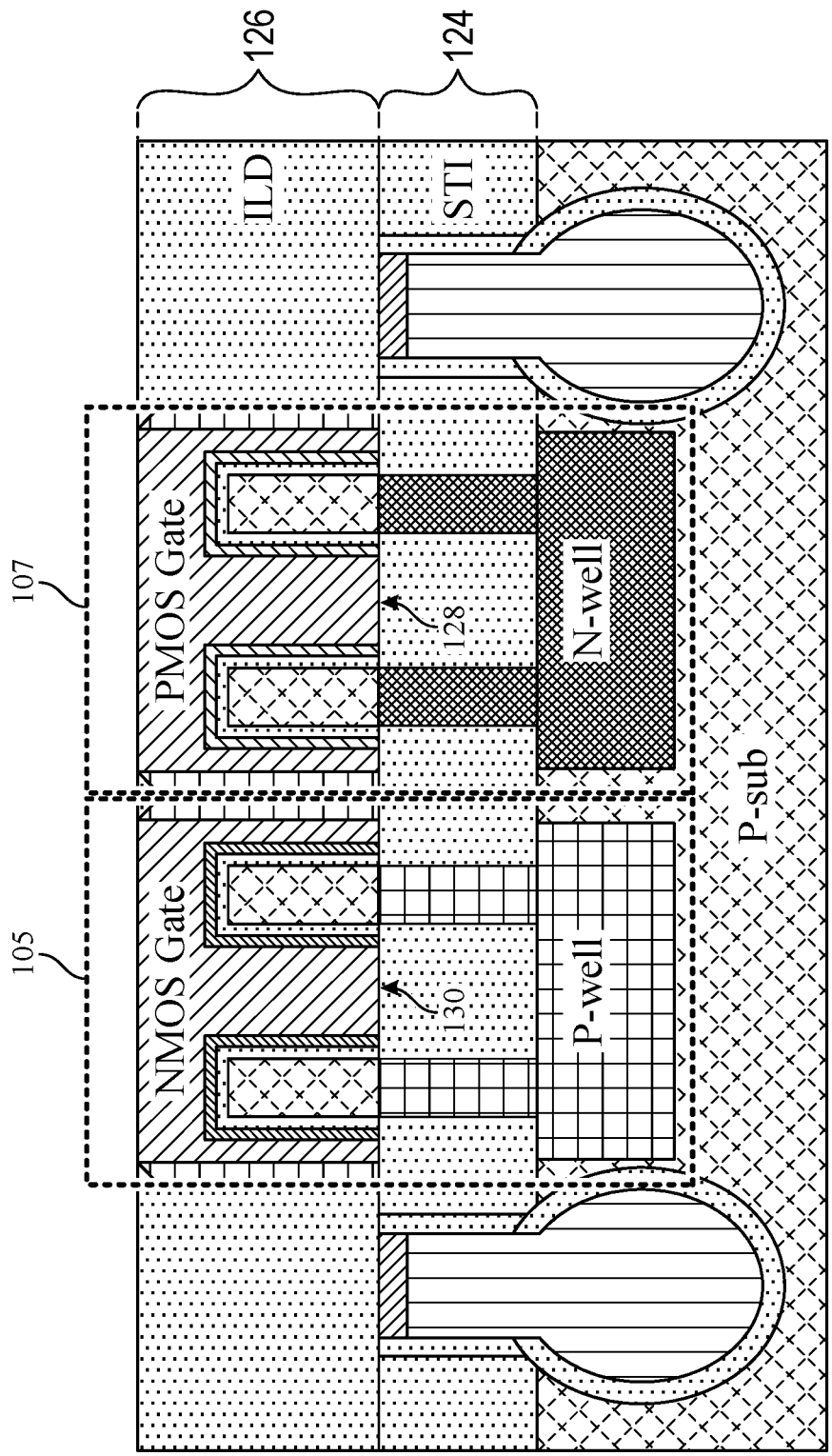

FIGS. 4A-4C illustrate example operations for fabricating the semiconductor device 101, in accordance with certain aspects of the present disclosure. The operations described with respect to FIGS. 4A-4C may be performed after the operations described with respect to FIGS. 3A and 3B. For example, after formation of oxide 307, the dummy fins 300, 302 may be etched to form holes 306 and 308, as illustrated in FIG. 4A. As illustrated in FIG. 4B, the inner surface of the holes 306, 308 may undergo oxide deposition (e.g., ALD) to form oxide layers 120, 122 for buried rail isolation. Additionally, the metal or metal alloy for rails 112, 114 may be deposited. Upper portions of rails 112, 114 may be etched and filled with silicon nitride ($Si_3N_4$) or other suitable materials to form hard masks 317, 319. The oxide 307 is then etched to form oxide layer 124. As illustrated in FIG. 4C, the oxide layer 126 may be deposited above the oxide layer 124. Additionally, gate structures 128 and 130 may be formed, as illustrated.

Figure 5:
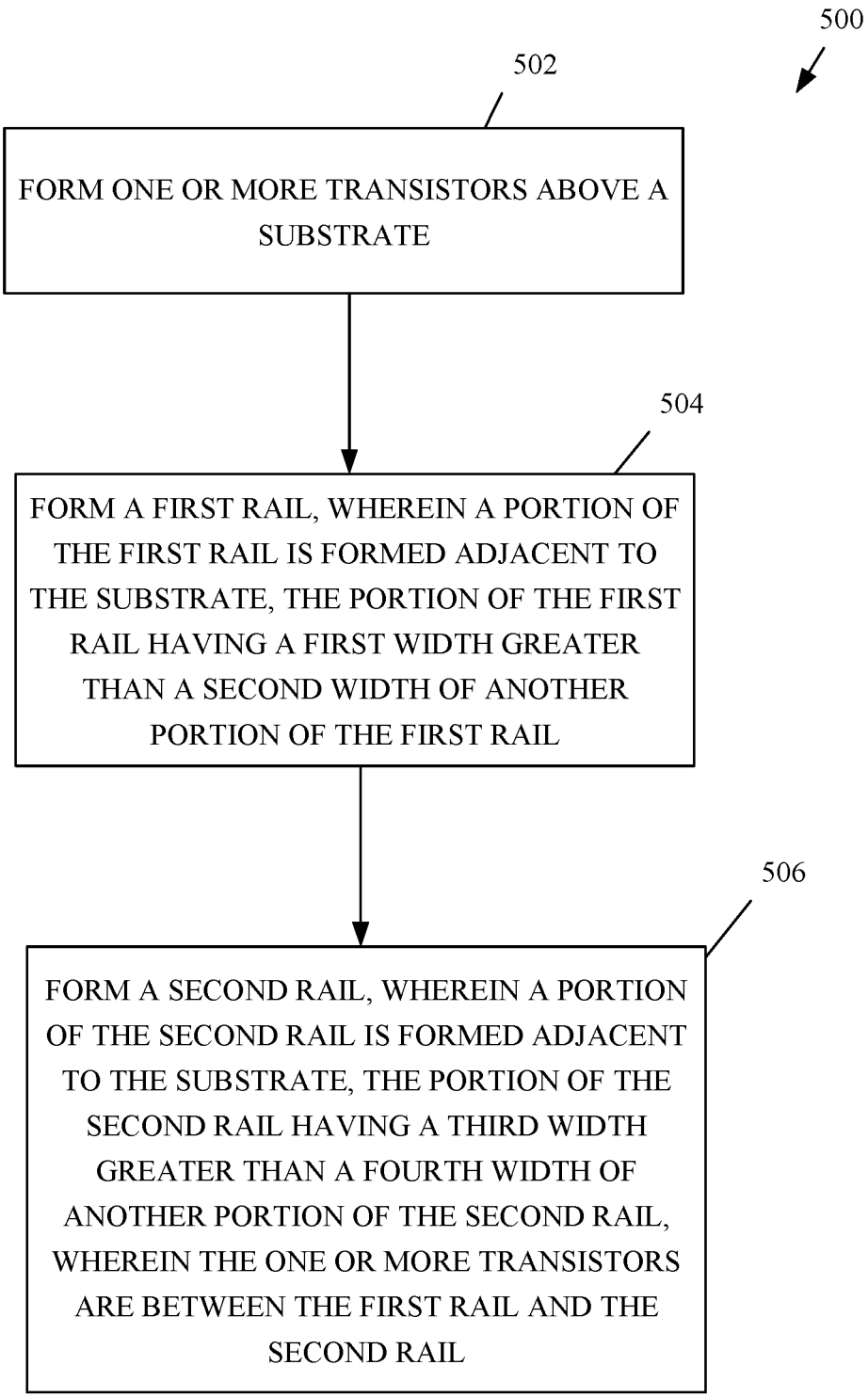
FIG. 5 is a flow diagram of operations for fabricating an example semiconductor device, in accordance with certain aspects of the present disclosure.

FIG. 5 is a block diagram of example operations 500 for fabricating a semiconductor device (e.g., the semiconductor device 100 depicted in FIG. 1), in accordance with certain aspects of the present disclosure. The operations 500 may be performed by a semiconductor fabrication facility, for example.

The operations 500 may begin at block 502, with the fabrication facility forming one or more transistors (e.g., NMOS transistor 105 and PMOS transistor 107) above a substrate (e.g., substrate 102). At block 504, the fabrication facility forms a first rail (e.g., power rail 112), where a portion of the rail is formed in the substrate (e.g., substrate 102), the portion of the first rail having a first width greater than a second width of another portion of the first rail. For example, the other portion of the first rail may be oval-shaped.

At block 506, the fabrication facility forms a second rail (e.g., ground rail 114), where a portion of the second rail is formed in the substrate (e.g., substrate 102), the portion of the second rail having a third width greater than a fourth width of another portion of the second rail. In certain aspects, the one or more transistors (e.g., NMOS transistor 105 and PMOS transistor 107) may be between the first rail (e.g., power rail 112) and the second rail (e.g., ground rail 114).

In certain aspects, forming the first rail may involve forming a dummy fin (e.g., dummy fin 300), etching the dummy fin to form a trench (e.g., hole 306), etching a portion of the substrate below the trench to extend the trench into the substrate and form a bottom portion of the trench that is wider than a top portion of the trench, and depositing electrically conductive material in the trench. In some aspects, forming the first rail may also include depositing an oxide layer (e.g., oxide layer 120) on a surface of the trench (e.g., inner surface of the hole 306) prior to depositing the conductive material.

In certain aspects the fabrication facility may further form the first rail or the second rail (e.g., power rail 112) by depositing an oxide layer (e.g., oxide layer 120) on a surface in the trench prior to depositing the conductive material (e.g., power rail 112).

In certain aspects, the fabrication facility may form the second rail (e.g., ground rail 114) by forming a dummy fin (e.g., dummy fin 302), etching the dummy fin (e.g., dummy fin 302) to form a trench (e.g., hole 308), etching a bottom portion of the trench to be wider than a top portion of the trench (e.g., as shown in FIG. 3D, hole 308), and depositing conductive material (e.g., ground rail 114) in the trench. In certain aspects, the fabrication facility may form the second rail (e.g., ground rail 114) by depositing an oxide layer (e.g., oxide layer 120) at the bottom portion of the trench prior to depositing the conductive material.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A semiconductor device, comprising:
a substrate;
a first rail, wherein a portion of the first rail is disposed in the substrate, the portion of the first rail having a first width greater than a second width of another portion of the first rail, wherein the portion of the first rail has an oval shape;
a second rail, wherein a portion of the second rail is disposed in the substrate, the portion of the second rail having a third width greater than a fourth width of another portion of the second rail; and
one or more transistors disposed above the substrate and between the first rail and the second rail, wherein:
an axis defines a transition from the portion of the first rail having the oval shape to the other portion of the first rail, the axis being aligned with a bottom of a fin of the one or more transistors,
the bottom of the fin of the one or more transistors is disposed at a first height above the substrate, and
a bottom of one or more gate regions of the one or more transistors is disposed at a second height above the substrate, the first height being different from the second height.

2. The semiconductor device of claim 1, further comprising an oxide layer disposed between the first rail and the substrate.

3. The semiconductor device of claim 1, wherein the portion of the second rail is oval shaped.

4. The semiconductor device of claim 1, wherein the other portion of the first rail is coupled to a contact region, the contact region being coupled to the one or more transistors.

5. The semiconductor device of claim 1, wherein the other portion of the second rail is coupled to a contact region, the contact region being coupled to the one or more transistors.

6. The semiconductor device of claim 1, further comprising an oxide layer disposed adjacent to the one or more gate regions of the one or more transistors, wherein a portion of the oxide layer is disposed above the other portion of the first rail, such that the first rail is recessed.

7. The semiconductor device of claim 1, further comprising an oxide layer disposed adjacent to the one or more gate regions of the one or more transistors, wherein a portion of the oxide layer is disposed above the other portion of the second rail, such that the second rail is a recessed rail.

8. The semiconductor device of claim 1, wherein the one or more transistors comprise a plurality of transistors, wherein the plurality of transistors are disposed between the first rail and the second rail, and wherein the first rail and the second rail extend parallel to a fin of each of at least two of the plurality of transistors.

9. The semiconductor device of claim 1, wherein the portion of the first rail and the portion of the second rail are disposed below an upper surface of the substrate and wherein the other portion of the first rail and the other portion of the second rail are disposed above the upper surface of the substrate.

10. The semiconductor device of claim 1, wherein the one or more transistors comprise complementary metal-oxide-semiconductor (CMOS) transistors.

11. The semiconductor device of claim 1, wherein the one or more transistors comprise a fin field-effect transistor (FinFET).

12. The semiconductor device of claim 1, wherein the one or more transistors comprise a gate-all-around field-effect transistor (GAA FET).

13. The semiconductor device of claim 1, wherein the first rail comprises a power rail and wherein the second rail comprises a ground rail.

14. A method for fabricating a semiconductor device, comprising:
   forming one or more transistors above a substrate;
   forming a first rail, wherein a portion of the first rail is formed in the substrate, the portion of the first rail having a first width greater than a second width of another portion of the first rail, wherein the portion of the first rail has an oval shape; and
   forming a second rail, wherein:
      a portion of the second rail is formed in the substrate, the portion of the second rail having a third width greater than a fourth width of another portion of the second rail,
      the one or more transistors are between the first rail and the second rail,
      an axis defines a transition from the portion of the first rail having the oval shape to the other portion of the first rail, the axis being aligned with a bottom of a fin of the one or more transistors,
      the bottom of the fin of the one or more transistors is disposed at a first height above the substrate, and
      a bottom of one or more gate regions of the one or more transistors is disposed at a second height above the substrate, the first height being different from the second height.

15. The method of claim 14, wherein forming the first rail or the second rail comprises:
   forming a dummy fin;
   etching the dummy fin to form a trench in a first oxide layer;
   etching a portion of the substrate below the trench to extend the trench into the substrate and form a bottom portion of the trench that is wider than a top portion of the trench; and
   depositing conductive material in the trench.

16. The method of claim 15, wherein forming the first rail or the second rail comprises depositing a second oxide layer on a surface of the trench prior to depositing the conductive material.

17. The method of claim 14, wherein the first rail comprises a power rail, and wherein the second rail comprises a ground rail.

18. The method of claim 14, wherein the portion of the second rail is oval shaped.

* * * * *